(12) United States Patent
Tseng

(10) Patent No.: US 6,340,614 B1
(45) Date of Patent: Jan. 22, 2002

(54) METHOD OF FORMING A DRAM CELL

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/678,639

(22) Filed: Oct. 3, 2000

(51) Int. Cl.$^7$ .......................................... H01L 21/8242
(52) U.S. Cl. ........................ 438/242; 438/255; 438/254
(58) Field of Search ................................ 438/242, 253, 438/254

(56) References Cited

U.S. PATENT DOCUMENTS 5,789,291 A * 8/1998 Sung ........................... 438/254
6,020,236 A * 2/1999 Lee et al. ................... 438/253

* cited by examiner

*Primary Examiner*—David Nelms
*Assistant Examiner*—Renee R. Berry
(74) *Attorney, Agent, or Firm*—Blakely Sokoloff Taylor & Zafman, LLP

(57) ABSTRACT

A method of forming a DRAM cell is disclosed. A heavily-doped region is formed in a semiconductor substrate. A first dielectric layer and a second dielectric layer are formed on the semiconductor substrate in sequence. A trench is next formed in the semiconductor substrate and also forming source/drain regions. First spacers with dopant source material are formed on sidewalls of the trench. After forming a gate dielectric layer within the trench, a first plug is formed on the gate dielectric layer. After forming an isolation film on the first plug and forming source/drain extensions, a second plug is formed on the isolation film. After removing the second dielectric layer, second spacers and third spacers are formed on sidewalls of the first spacers. After removing the second spacers and upper portions of the first spacers, a capacitor is formed on the transistor.

20 Claims, 2 Drawing Sheets

METHOD OF FORMING A DRAM CELL

BACKGROUND OF THE INVENTION (1) Field of the Invention

The present invention relates generally to a method of manufacturing a DRAM cell, and more particularly, to a method of forming a DRAM cell with a capacitor having high capacitance directly over a transistor having a recessed-gate (2) Description of the Related Art Integrated circuits (ICs), such as ultra-large scale integrated (ULSI) circuits, can include as many as one billion transistors or more. The ULSI circuits are generally composed of complementary metal oxide semiconductor field effect transistors (MOSFETs). Each MOSFET contains a gate electrode disposed between a drain region and a source region. In order to increase the device density and operating speed of the integrated circuits, the feature size of transistors within the circuits must be shrunk down. Particularly, in scaling down devices, a P-channel or an N-channel with shorter channel length is needed to enhance the operating speed.

Generally, photolithography process is a critical technique for shortening the channel length of a MOSFET. It is believed that the achievable minimum channel length depends on the photolithography limit of the lithographic tool, e.g. a stepper or a scanner.

In order to succeed at sub-0.1 um gate dimensions and below, a recessed-gate MOSFET with out-diffused source/drain extension was disclosed in U.S. Pat. No. 6,093,947. According to this prior art, a semiconductor wafer with a plurality of shallow trench isolation (STI) is provided. A pad oxide layer and a dielectric layer are formed on the semiconductor wafer. Next, a hole is formed in the structure extending into the semiconductor wafer. The hole has sidewalls and a bottom wall. Thereafter, oxide spacer regions are formed on the sidewalls of the hole, wherein the oxide spacer regions contain a dopant material which can out-diffuse when subjected to annealing.

After that, a gate oxide region is formed on the bottom wall of the hole. After that, a conformal layer of polysilicon is formed in the hole and on the dielectric layer, and a CMP process is next performed to remove the portions of the polysilicon layer outside the hole.

Thereafter, the dielectric layer is removed to expose the pad oxide layer and outer walls of the oxide spacer regions. Source/drain regions are next formed in the semiconductor wafer adjacent to the hole.

Finally, an annealing process is performed to cause out-diffusion of the dopant from the oxide spacer regions to the semiconductor wafer so as to form an extension which wraps around the oxide spacer regions and provides a connection to a channel region which is located beneath the gate oxide region. After that, nitride double spacers are formed over the pad oxide layer. Finally, metal contacts are formed in the structure.

However, according to the prior art, two more polysilicon layers above the transistor (such as poly 2/poly 3, or poly 3/poly 4) are needed to form a stacked capacitor for a DRAM cell. The stacked capacitor results in a high topology on the semiconductor substrate, so that the subsequent photolithography and etching processes for patterning the stacked capacitor are difficult to perform. Frequently, this drawback decreases the production yield very much. On the other hand, according to the prior art, an extra trench is needed to form a trench capacitor for a DRAM cell. The trench capacitor wastes a great deal of wafer area, and production cost is thus enlarged. In order to achieve good production yield and low production cost, it will be necessary to develop a new technology for forming a DRAM cell.

SUMMARY OF THE INVENTION

Accordingly, it is a primary object of the present invention to provide a method of forming a DRAM cell with a capacitor having high capacitance directly over a transistor having a recessed-gate.

It is another object of the present invention to provide a DRAM cell with a capacitor having high capacitance directly over a transistor having a recessed-gate.

A method of forming a DRAM cell with a capacitor having high capacitance directly over a transistor having a recessed-gate is disclosed. First, some isolation regions such as shallow trench isolation (STI) regions are formed in a semiconductor substrate. A heavily-doped region is then formed in the semiconductor substrate. Thereafter, a first dielectric layer and a second dielectric layer are formed on the semiconductor substrate in sequence. The first dielectric layer and the second dielectric layer should have selective etchability. Typically, the first dielectric layer is composed of silicon dioxide, and the second dielectric layer is a thick film and composed of silicon nitride.

A trench is next formed in the semiconductor substrate by an anisotropic etching process. In addition, the source/drain regions of the transistor are also formed in the anisotropic etching process. After that, the first spacers with dopant source material are formed on the sidewalls of the trench. After forming a gate dielectric layer within the trench, a first plug is formed on the gate dielectric layer as a gate plug of the transistor. After forming an isolation film on the first plug, source/drain extensions of the transistor are formed by annealing to out-diffuse the dopant source material contained in the first spacers.

Thereafter, a second plug is formed on the isolation film, so that the top surface of the second plug has the same level with the top surface of the second dielectric layer. After removing the second dielectric layer by performing a wet etching process, the second spacers are formed on the sidewalls of the first spacers. The second spacers are composed of silicon dioxide.

After that, the third spacers are formed on the sidewalls of the second spacers, wherein the third spacers is composed of conductive material, such as doped polysilicon. After removing the second spacers and the upper portions of the first spacers, a capacitor is formed on the transistor.

During the processes of forming the capacitor, a conductive layer is first deposited. Next, the conductive layer is patterned by performing a photolithography process and an etching process to form the lower electrode of the capacitor. After forming the capacitor dielectric, the upper electrode of the capacitor is then formed on the capacitor dielectric.

BRIEF DESCRIPTION OF THE DRAWINGS

The accompanying drawings forming a material part of this description, in which.

DESCRIPTION OF THE PREFERRED EMBODIMENTS

The present invention relates generally to a method of manufacturing a DRAM cell, and more particularly, to a method of forming a DRAM cell with a capacitor having high capacitance directly over a transistor having a recessed-gate.

Figure 1:
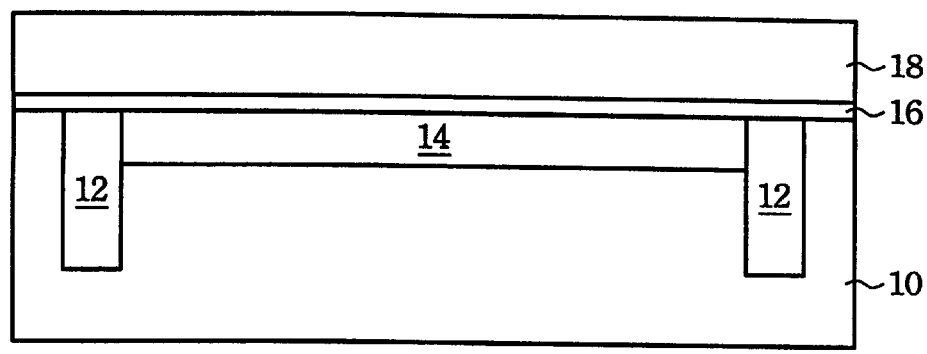
FIG. 1 to FIG. 6 schematically illustrate the cross-sectional diagram of the method of forming a DRAM cell with a capacitor having high capacitance directly over a transistor having a recessed-gate according to the present invention.

Referring first to FIG. 1, a semiconductor substrate 10 comprised of P-type single crystalline silicon is provided. Shallow trench isolation regions (STI) 12 are next formed in the semiconductor substrate 10. Thereafter, an ion implantation process is performed to form a heavily-doped region 14. After that, a first dielectric layer 16 and a second dielectric layer 18 are formed on the semiconductor substrate 10 in sequence.

The shallow trench isolation regions 12 are formed by first forming shallow trenches in the semiconductor substrate 10 using the conventional photolithographic and anisotropic reactive ion etching (RIE) procedures. After removal of the photoresist shape used to define the shallow trenches, a silicon oxide layer is deposited by low pressure chemical vapor deposition (LPCVD) or plasma enhanced chemical vapor deposition (PECVD) procedures for completely filling the shallow trenches. A chemical mechanical polishing (CMP) process is then performed to remove silicon oxide from the top surface of the semiconductor substrate 10. The dose of the dopant ions in the heavily-doped region 14 ranges from 2E15 to 9E15 ions/cm$^2$ of the appropriate dopant ions, e.g., arsenic (As) or phosphorous (P) for an illustrative N-channel MOSFET (NMOS transistor) or boron (B) for an illustrative P-channel MOSFET (PMOS transistor). The implant energy of the dopant ions ranges from approximately 15 to 25 keV. The dopant ions can thus be implanted to a depth of between 1000 to 2000 Angstroms within the semiconductor substrate 10. The first dielectric layer 16 is formed by conventional deposition process such as PECVD or LPCVD to a thickness between 50 to 200 Angstroms. The first dielectric layer 16, which serves as a pad layer, is composed of silicon dioxide (SiO$_2$), TiO$_2$, Ta$_2$O$_5$ and the like. The second dielectric layer 18 is composed of silicon nitride or silicon oxynitride, and deposited by a low-pressure CVD (LPCVD) process or a plasma-enhanced CVD (PECVD) process to a thickness between 3000 to 10000 Angstroms. The first dielectric layer and the second dielectric layer should have selective etchability. The key feature of the present invention is that the second dielectric layer 18 is a thick film for manufacturing the capacitor of the DRAM cell subsequently.

Figure 2:
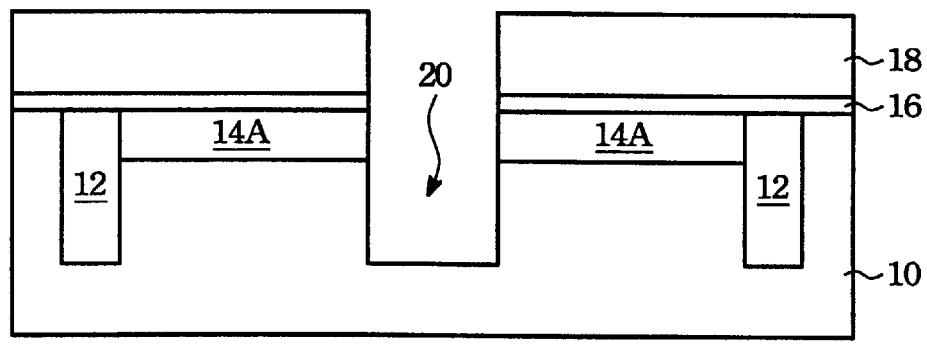

As shown in FIG. 2, an opening is formed in the second dielectric layer 18 and the first dielectric layer 16 by performing the conventional lithography and anisotropic etching techniques. After that, an anisotropic RIE process using Cl$_2$ as the etchant is performed to the semiconductor substrate 10 through the opening to form a trench 20. According to one embodiment of the present invention, the width of the trench 20 ranges from 0.1 um to 0.2 um. According to another embodiment of the present invention, the width of the trench 20 is less than 0.1 um.

In addition, because the bottom wall of the trench 20 is deeper than the junction depth of the heavily-doped region 14, the trench 20 penetrates the heavily-doped region 14 to form source/drain regions 14A during the anisotropic RIE process. The depth of the trench 20 ranges from 3000 to 10000 Angstroms.

Figure 3:
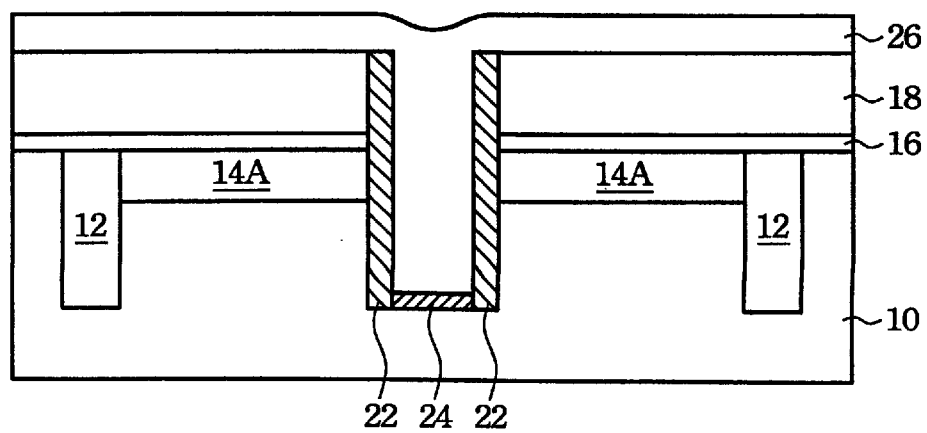

Referring now to FIG. 3, first spacers 22 containing a dopant source material are formed on the sidewalls of the trench 20. A wet etching process is next performed to remove the surface defect of the silicon substrate. Thereafter, a gate dielectric layer 24 is next formed on the semiconductor substrate 10 within the trench 20.

During the processes for forming the first spacers 22, an oxide layer with a dopant source material is first deposited by a conventional deposition process such as PECVD or LPCVD. Thereafter, an anisotropic RIE process is performed to etch back the oxide layer and form the first spacers 22. The first spacers 22 contain a P-type (e.g. B) or N-type (e.g. As, P) dopant source material, so that the dopant material can be out-diffused from the first spacers 22 into the semiconductor substrate 10 by annealing. The wet etching process is performed by a mixed solution of NH$_4$F and HF, which shall etch silicon substrate only. The gate dielectric layer 24 comprised of silicon dioxide or nitrogen-rich oxide is formed by performing a thermal oxidation process or a chemical vapor deposition process. According to one embodiment of the present invention, the gate dielectric layer 24 has a thickness between 20 to 30 Angstroms. According to another embodiment of the present invention, the gate dielectric layer 24 has a thickness less than 20 Angstroms.

Figure 4:
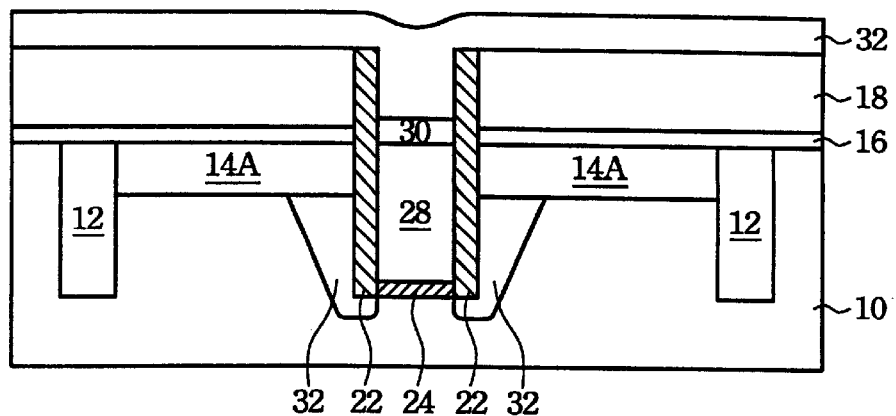

After that, a first electric conductive layer 26 is deposited on the gate dielectric layer 24, the first spacers 22, and the second dielectric layer 18. The first electric conductive layer 26 is a layer of doped polysilicon and formed by a LPCVD or a PECVD process. The polysilicon can be doped in-situ during deposition via the addition of boron, arsine, or phosphine to a silane ambient. On the other hand, the electric conductive layer can be first deposited intrinsically, and then doped via an ion implantation process. Next, a first plug 28 is formed within the trench 20 by an etching-back process, as shown in FIG. 4. The first plug 28 serves as the recessed-gate of the transistor of the DRAM cell. Thereafter, a thermal oxidation process is then performed to form an isolation film 30 on the first plug 28. An annealing process is also performed to out-diffuse the dopant source material in the first spacers 22 into the semiconductor substrate 10 to form source/drain extensions 32 of the transistor. The annealing process is generally performed by a rapid thermal annealing process (RTA). The source/drain extensions 32 wrap around the oxide spacers 22 and connect the source/drain regions 14A to the channel which is located beneath the gate dielectric layer 24. After that, a second electric conductive layer 32 is deposited on the isolation film 30, the first spacers 22, and the second dielectric layer 18 to a thickness between 2000 to 5000 Angstroms to refill the trench 20. The second electric conductive layer 32 is also a layer of doped polysilicon and formed by a LPCVD or a PECVD process. The polysilicon can be doped in-situ during deposition via the addition of boron, arsine, or phosphine to a silane ambient. On the other hand, the electric conductive layer 32 can be first deposited intrinsically, and then doped via an ion implantation process.

Figure 5:
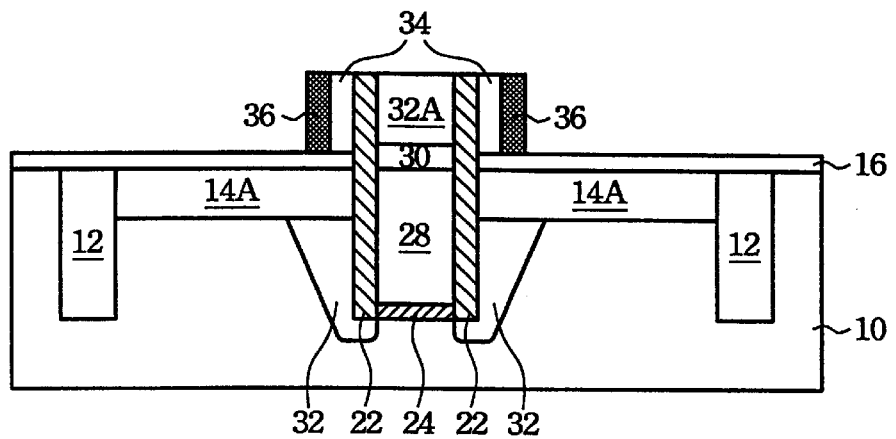

Referring now to FIG. 5, a second plug 32A is formed by performing a CMP process to remove the portion of the second electric conductive layer 32 outside the trench 20. After that, the second dielectric layer 18 is removed by using a H$_3$PO$_4$ solution. Next, second spacers 34 are formed on the sidewalls of the first spacers 22. During the processes for forming the second spacers 34, a dielectric layer such as an oxide layer is first deposited by a conventional deposition process such as PECVD or LPCVD. Thereafter, an anisotropic RIE process is performed to etch back the dielectric layer and form the second spacers 34. Thereafter, third spacers 36 are formed on the sidewalls of the second spacers 34. During the processes for forming the third spacers 36, a conductive layer such as a doped polysilicon layer is first deposited by a conventional deposition process such as PECVD or LPCVD. Thereafter, an anisotropic RIE process is performed to etch back the conductive layer and form the third spacers 36. The polysilicon can be doped in-situ during deposition via the addition of boron, arsine, or phosphine to a silane ambient. On the other hand, the electric conductive layer can be first deposited intrinsically, and then doped via an ion implantation process.

Figure 6:
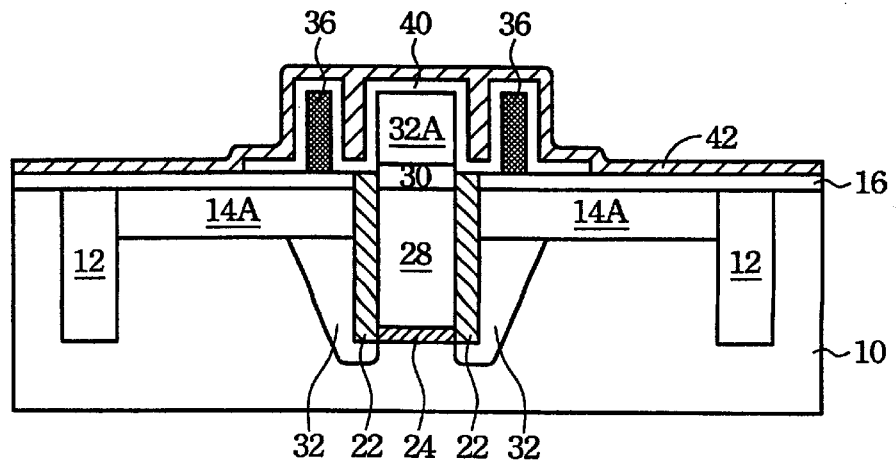

Referring now to FIG. 6, the second spacers 34 and the upper portions of the first spacers 22 are removed by performing a wet etching process, so that the sidewalls of the second plug 32A is exposed. Next, the lower electrode 40 of the capacitor of the DRAM cell is formed by depositing a conductive layer (such as a polysilicon layer) and then patterning the conductive layer. Thereafter, the capacitor dielectric layer (not shown in the figure) and the upper electrode of the capacitor 42 are formed in sequence on the lower electrode 40.

The key feature of the present invention is that the lower electrode 36 of the capacitor is located not only on the sidewalls of the second plug 32A, but also on the sidewalls of the third spacers 36. For this reason, the capacitor area is largely enhanced, so the capacitance of the capacitor is enlarged.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

I claim:

1. A method of forming a DRAM cell with a capacitor directly over a transistor having a recessed-gate, the method comprising:
   a. forming isolation regions in a semiconductor substrate;
   b. forming a heavily-doped region in said semiconductor substrate;
   c. forming a first dielectric layer and a second dielectric layer on said semiconductor substrate;
   d. forming a trench in said semiconductor substrate by an anisotropic etching process and also forming source/drain regions of said transistor, wherein said trench is prepared for fabricating said recessed-gate;
   e. forming first spacers with dopant source material on sidewalls of said trench;
   f. forming a gate dielectric layer within said trench;
   g. forming a first plug on said gate dielectric layer as a gate plug;
   h. forming an isolation film on said first plug;
   i. forming source/drain extensions of said transistor;
   j. forming a second plug on said isolation film, wherein a top surface of said second plug has the same level with a top surface of said second dielectric layer;
   k. removing said second dielectric layer;
   l. forming second spacers on sidewalls of said first spacers;
   m. forming third spacers on sidewalls of said second spacers, wherein said third spacers is composed of conductive material;
   n. removing said second spacers and upper portions of said first spacers; and
   o. forming said capacitor on said second plug and said third spacers.

2. The method of claim 1, wherein said heavily-doped region is formed by performing an ion implantation process.

3. The method of claim 1, wherein said first dielectric layer and said second dielectric layer have selective etchability.

4. The method of claim 1, wherein said first dielectric layer is composed of silicon dioxide.

5. The method of claim 1, wherein said second dielectric layer has a thickness between 3000 to 10000 Angstroms.

6. The method of claim 5, wherein said second dielectric layer is composed of silicon nitride.

7. The method of claim 5, wherein said second dielectric layer is composed of silicon oxynitride.

8. The method of claim 1, wherein a id wall of said trench is deeper than a junction depth of said heavily-doped region.

9. The method of claim 1, wherein said anisotropic etching process comprises continuous etching processes for etching said second dielectric layer, said first dielectric layer, and said semiconductor substrate in sequence.

10. The method of claim 1, wherein said first spacers are formed by first depositing a doped insulator layer and then performing an anisotropic etching process to etch back said doped insulator layer.

11. The method of claim 10, wherein said insulator layer is an oxide layer.

12. The method of claim 1, wherein said gate dielectric layer is formed by performing a thermal oxidation process.

13. The method of claim 12, wherein said gate dielectric layer has a thickness less than 20 Angstroms.

14. The method of claim 1, wherein said first plug is formed by first depositing a conductive layer and then performing an anisotropic etching process to etch back said conductive layer.

15. The method of claim 14, wherein said conductive layer is a doped polysilicon layer.

16. The method of claim 1, wherein said isolation film is formed by performing a thermal oxidation process.

17. The method of claim 1, wherein said source/drain extensions are formed by performing an annealing process to out-diffuse said dopant source material contained in said first spacers.

18. The method of claim 1, wherein said second spacers are formed by first depositing an oxide layer and then performing an anisotropic etching process to etch back said oxide layer.

19. The method of claim 1, wherein said third spacers are formed by first depositing a doped polysilicon layer and then performing an anisotropic etching process to etch back said doped polysilicon layer.

20. The method of claim 1, wherein forming said capacitor on said second plug and said third spacers further comprises:
   a. forming a first conductive layer;
   b. patterning said first conductive layer to form a lower electrode of said capacitor;
   c. forming a second conductor layer on said lower electrode;
   d. forming a second conductor layer on said capacitor dielectric layer to form an upper electrode of said capacitor.

* * * * *